US010645840B2

(12) United States Patent
Timmins et al.

(10) Patent No.: US 10,645,840 B2
(45) Date of Patent: May 5, 2020

(54) ACTIVE ELECTRONICALLY STEERED ARRAY WITH WAVEGUIDE MANIFOLD THERMOCOUPLED TO ICS AS A HEATSINK

(71) Applicant: AvL Technologies, Inc., Asheville, NC (US)

(72) Inventors: Ian J. Timmins, Seminole, FL (US); Wayne Holt, Dacula, GA (US); Alan Ellis, Candler, NC (US); Adam C. Gropp, Candler, NC (US); Keith Edenfield, Weaverville, NC (US); Bruce Barratt, Asheville, NC (US)

(73) Assignee: AvL Technologies, Inc., Asheville, NC (US)

( * ) Notice: Subject to any disclaimer, the term of this patent is extended or adjusted under 35 U.S.C. 154(b) by 0 days.

(21) Appl. No.: 16/284,824

(22) Filed: Feb. 25, 2019

(65) Prior Publication Data

US 2019/0327855 A1 Oct. 24, 2019

Related U.S. Application Data

(60) Provisional application No. 62/661,357, filed on Apr. 23, 2018.

(51) Int. Cl.
*H05K 7/20* (2006.01)
(52) U.S. Cl.
CPC ..... *H05K 7/20163* (2013.01); *H05K 7/20154* (2013.01); *H05K 7/20536* (2013.01)

(58) Field of Classification Search
None
See application file for complete search history.

(56) References Cited

U.S. PATENT DOCUMENTS

| 5,208,733 | A | 5/1993 | Besanger |
| 5,812,374 | A | 9/1998 | Shuff |
| 5,826,643 | A | 10/1998 | Galyon et al. |
| 5,973,923 | A | 10/1999 | Jitaru |
| 2003/0142481 | A1* | 7/2003 | Kinoshita ........... B60R 16/0239 361/719 |
| 2004/0042179 | A1 | 3/2004 | Murphy |
| 2005/0156789 | A1* | 7/2005 | Mohamadi ............... H01Q 1/38 343/700 MS |

(Continued)

*Primary Examiner* — Jacob R Crum
(74) *Attorney, Agent, or Firm* — William G. Heedy; The Van Winkle Law Firm

(57) ABSTRACT

A heatsink for heat dissipation amongst an active electronically steered array (AESA) on a printed circuit board (PCB) includes a metal plate having a first side and a second side; a plurality of integrally formed pockets on the first side of the metal plate each being sized and configured for congruent receipt of a corresponding one of a plurality of functional blocks of the AESA on the PCB; a plurality of waveguide manifolds on the second side of the metal plate including a plurality of holes that launch a wave transmission and a plurality of slots that guide the direction of the wave transmission; and wherein the metal plate prevents localized overheating amongst the AESA by positioning the metal plate on the PCB wherein the plurality of integrally formed pockets and the plurality of holes and the plurality of slots of the plurality of waveguide manifolds facilitate heat dissipation.

4 Claims, 5 Drawing Sheets

(56) References Cited

U.S. PATENT DOCUMENTS

2007/0139287 A1* 6/2007 Inomata .................. G01S 7/032
                                                    343/786
2007/0177356 A1   8/2007 Panek
2011/0075377 A1* 3/2011 Paquette ............ H05K 7/20509
                                                    361/709

* cited by examiner

ACTIVE ELECTRONICALLY STEERED ARRAY WITH WAVEGUIDE MANIFOLD THERMOCOUPLED TO ICS AS A HEATSINK

RELATED APPLICATION

This application claims the benefit of U.S. Provisional Patent Application Ser. No. 62/661,357 filed on Apr. 23, 2018.

This invention was made with Government support under Small Business Innovation Research Contract No. FA8650-18-P-9200 awarded by AFRL Wright Research Site (AFRL/RQKDA). The Government has certain rights in the invention.

FIELD OF THE INVENTION

This invention relates to a heatsink for active electronically steered array (AESA) on a printed circuit board (PCB) structure to dissipate heat generated by integrated circuits (ICs). Particularly, this invention presents a metal plate containing "pockets" enclosing each functional block of the AESA to sink heat and waveguide manifolds that function as RF transmission lines for reducing signal loss as well as dissipating heat.

BACKGROUND OF THE INVENTION

Thermal performance of printed circuit boards (PCBs) is an important factor for PCB design. In antenna systems, the concentrated integrated circuits (ICs) that constitute an actively electronically steered array (AESA) generate heat that may cause localized overheating that can impair the performance of the electrical components. The PCB itself is generally not a good thermal conductor because the substrates of the PCB are typically made of insulating dielectric materials. To avoid localized overheating and in an attempt to ensure the normal performance of the electrical components, various methods are employed for heat dissipation, such as electrically conductive adhesives, thermal vias placed underneath the electrical components, and external heatsink.

Further, localized heat dissipation methods have been developed using pieces of copper that are integrated into the PCB during its production process, including press-fitted copper coins, adhesive bonded copper coins, and embedded copper coins. Each of these methods have certain limitations, however. For example, the press-fitting methods is limited to a PCB sized 40 mm by 40 mm due to overstressing. Accordingly, there still exists a need for an effective heat dissipation method to avoid localized overheating.

SUMMARY OF THE INVENTION

In accordance with one form of the invention, there is provided a heatsink for heat dissipation amongst an active electronically steered array (AESA) on a printed circuit board (PCB) including a metal plate including a first side and a second side; a plurality of integrally formed pockets on the first side of the metal plate each being sized and configured for congruent receipt of a corresponding one of a plurality of functional blocks of the AESA on the PCB; a plurality of waveguide manifolds on the second side of the metal plate including a plurality of holes that launch a wave transmission and a plurality of slots that guide the direction of the wave transmission; and wherein the metal plate prevents localized overheating amongst the AESA by positioning the metal plate on the PCB wherein the plurality of integrally formed pockets and the plurality of holes and the plurality of slots of the plurality of waveguide manifolds facilitate heat dissipation.

BRIEF DESCRIPTION OF THE DRAWINGS

For a fuller understanding of the nature of the present invention, reference should be made to the following detailed description, taken in conjunction with the accompanying drawings in which.

Like reference numerals refer to like parts throughout the several views of the drawings.

DETAILED DESCRIPTION OF THE PREFERRED EMBODIMENTS

Referring to the several views of the drawings, a heatsink for active electronically steered array (AESA) with waveguide manifold thermocoupled to integrated circuits (ICs) is shown and generally indicated as 300.

Figure 1:
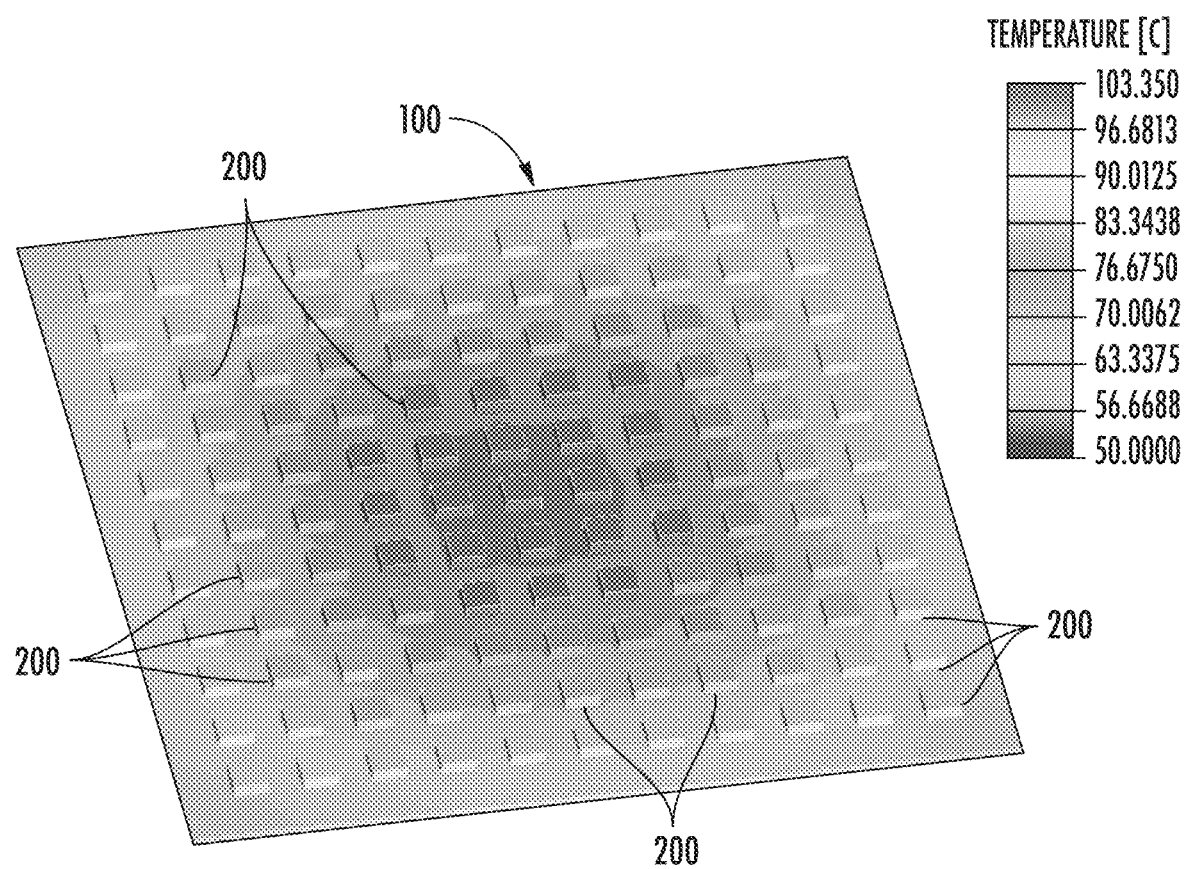
FIG. 1 illustrates a thermal simulation of temperature distribution among an active electronically steered array (AESA) containing integrated circuits (ICs) that generate heat on a printed circuit board (PCB) structure.

Referring to FIG. 1, a thermal simulation is illustrated of temperature distribution amongst an AESA containing integrated circuits (ICs) that generate heat on a printed circuit board (PCB) structure. On the PCB structure 100, there is a collective antenna array, i.e. the AESA comprising functional blocks 200 of ICs. In the exemplified FIG. 1, the AESA consists of an 11 by 11 grid of functional blocks 200. Without any control on heat dissipation, the simulated thermal distribution shows an elevated temperature of 103.35° C. around the central nine functional blocks 200 of the AESA on the PCB structure 100. The overheating is concentrated within the center of the AESA, and the temperature decreases radially from the center to the periphery of the AESA. The temperature along the four edges of the PCB structure 100 is around 90° C., while the temperature of the four corners of the PCB structure 100 is around 85° C. This localized overheating within the center of the AESA is detrimental to the normal performance of electrical components, such as field-programmable gate arrays (FPGAs) and ICs. Therefore, effective heat dissipation is required to decrease the temperature among the AESA, particularly around the heat generating sources, the ICs.

Figure 2:
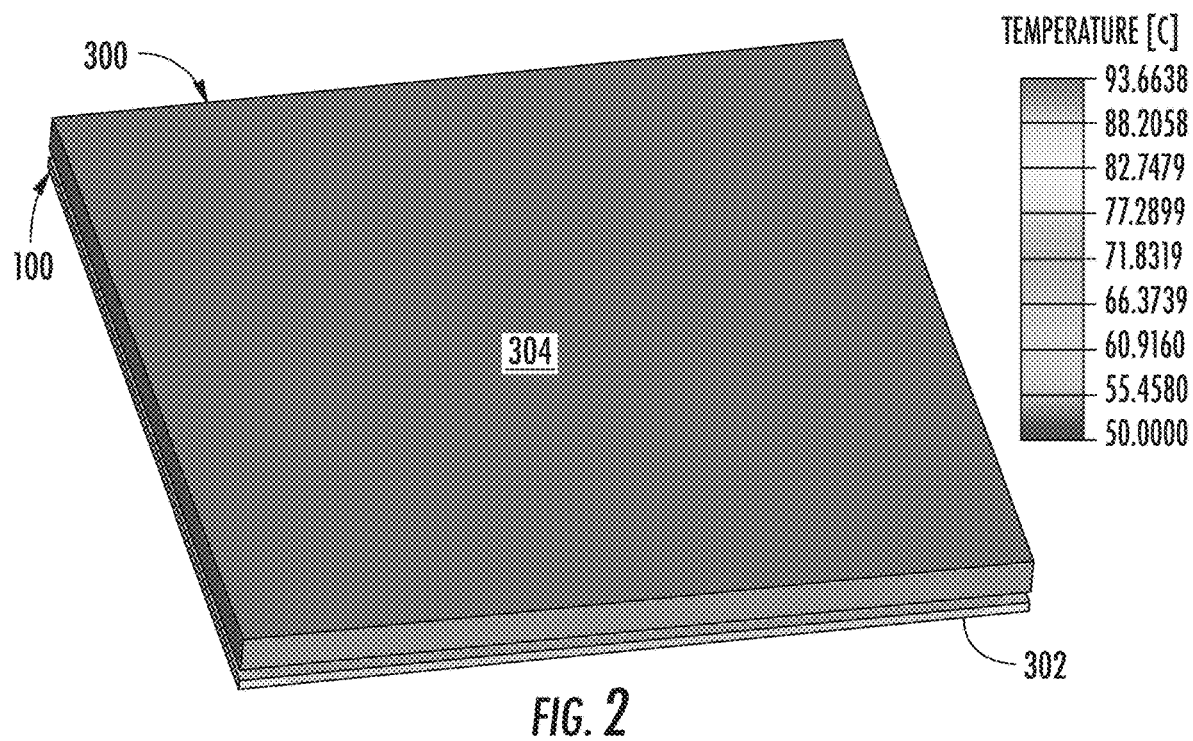
FIG. 2 illustrates a thermal simulation of temperature distribution among a heatsink positioned on the PCB structure.

FIG. 2 illustrates a thermal simulation of temperature distribution among a heatsink 300 positioned on the PCB structure 100 covering the whole AESA. The heatsink 300 is an external metal plate. In one embodiment, the metal plate is made of aluminum. A first side 302 of the heatsink 300 covers the AESA and contains a plurality of integrally formed pockets 400 each enclosing one functional block 200 of the AESA. Such a "pocket" structure of the heatsink 300 seamlessly fits the AESA, i.e. a collective antenna array of ICs, significantly prevents overheat and generates a more even temperature distribution. Still referring to FIG. 2, the overall temperature of the second side 304 of the heatsink 300 is around 93.7° C. and is evenly distributed on the second side 304.

Figure 3:
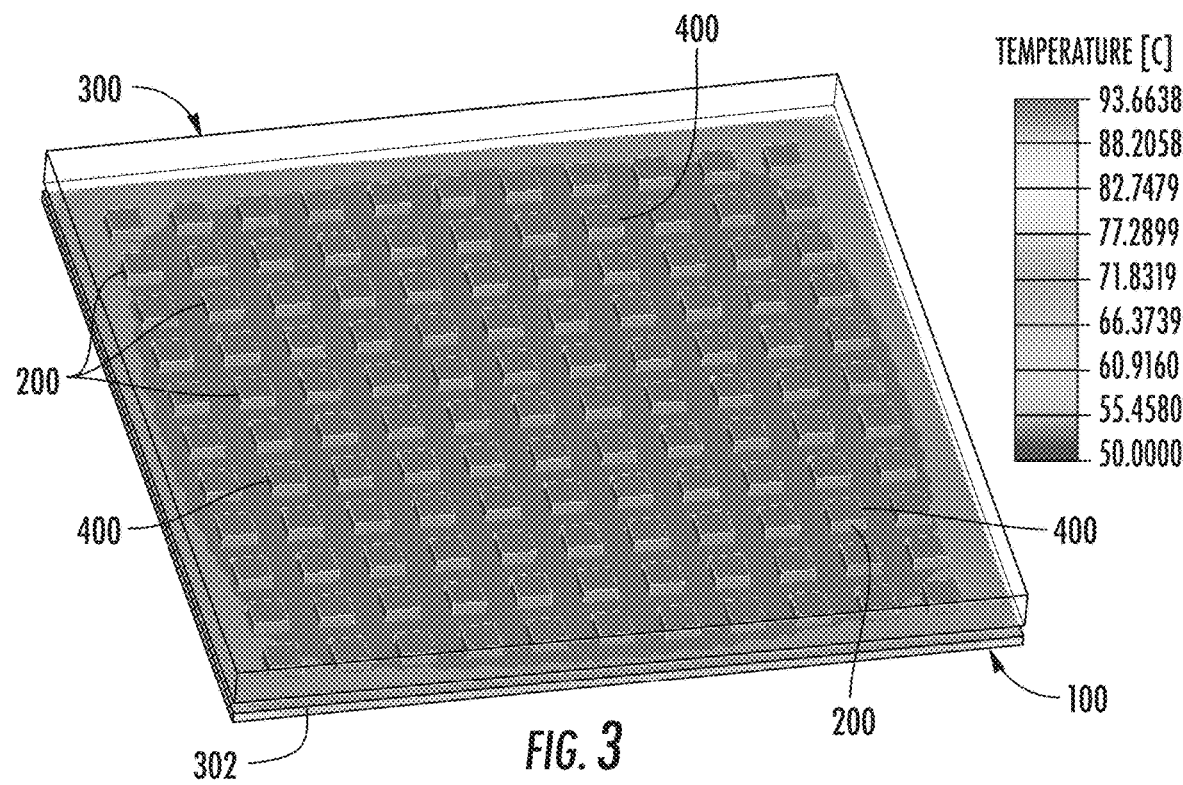
FIG. 3 illustrates a thermal simulation of temperature distribution among the AESA on the PCB structure that are effectively cooled by the heatsink enclosing each functional block of the AESA.

Referring now to FIG. 3, underneath the heatsink 300 the temperature around each functional block 200 of the AESA on the PCB structure 100 is also evenly distributed, at a temperature of around 93.7° C., except the functional blocks 200 nearing the four corners of the PCB structure 100, which are at a temperature even lower. Compared to the temperature distribution among the AESA containing ICs on the PCB structure 100 without using the heatsink 300 in FIG. 1, the heatsink 300 effectively dissipates heat more evenly and further lowers the highest temperature from 103.35° C. to 93.7° C. Accordingly, the heat dissipation provided by heatsink 300 prevents localized overheating in the center of the AESA and ensures the normal performance of the electrical components, such as ICs.

Figure 4:
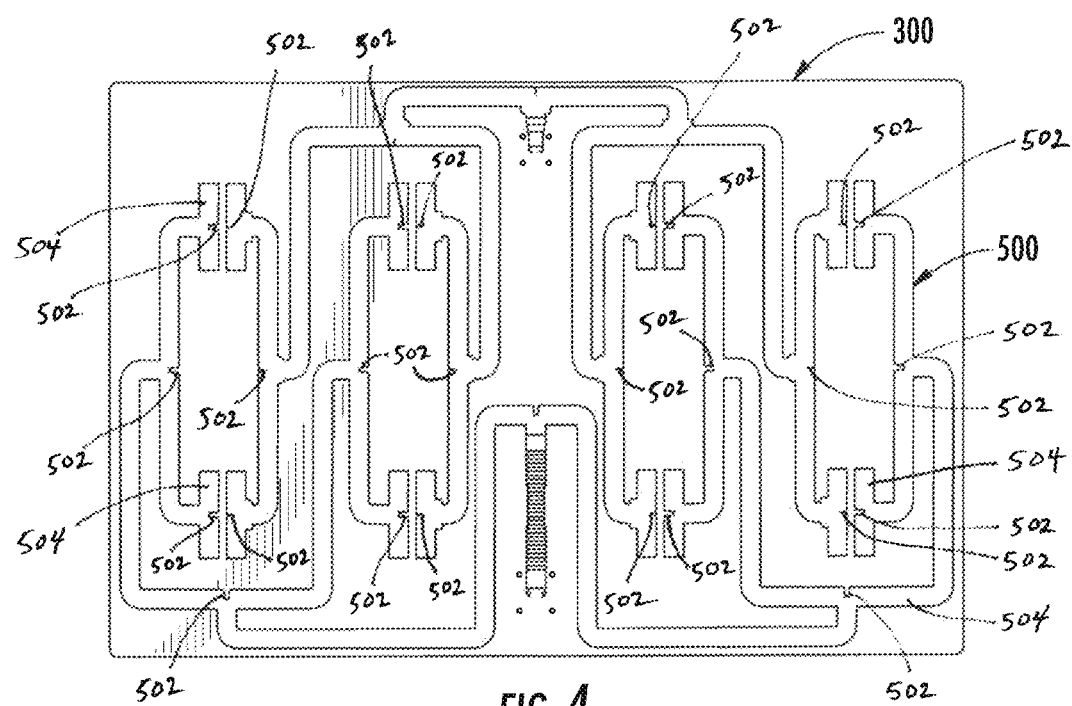
FIG. 4 is a view of a first side of the heatsink on which a plurality of pockets are situated.
Figure 5:
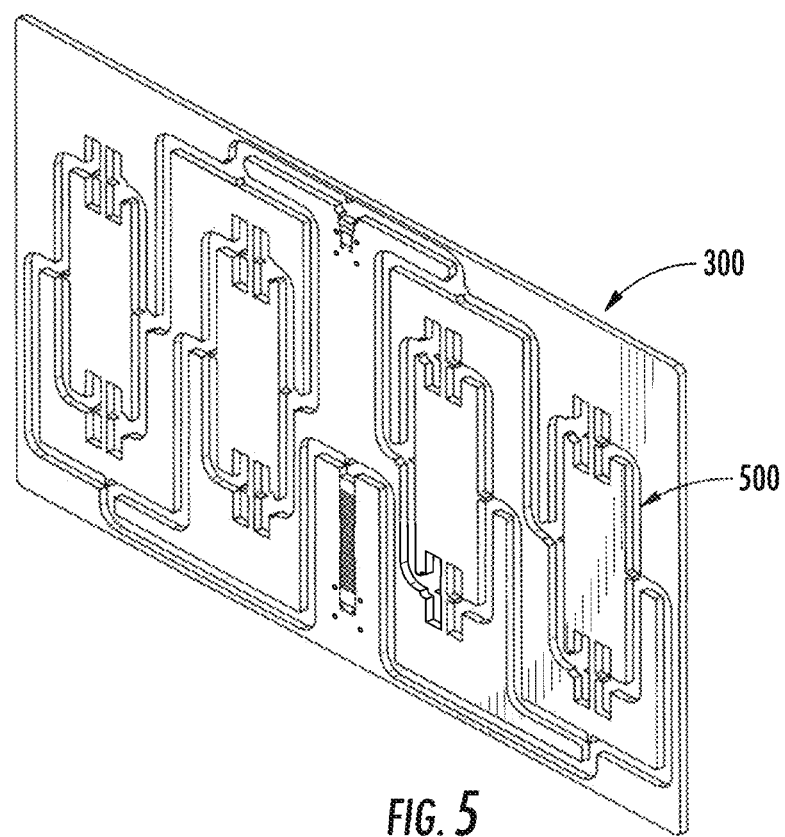
FIG. 5 is a view of an opposing, second side of the heatsink on which the waveguide manifold is situated.

Referring to FIG. 4, the heatsink 300 is generally formed from metal and, in one embodiment, is an aluminum plate. In one embodiment, the dimensions of the heatsink 300 are 16.71 inches by 11.14 inches. On the first side 302 of the heatsink 300, there are integrally formed pockets 400 sized and configured to enclose each functional block 200 of the AESA. On the second side 304 of the heatsink 300, there are waveguide manifolds 500 including holes 502 that launch a wave transmission and slots 504 that guide the direction of the wave transmission. The waveguide manifold also provides the function of an RF transmission line while thermally assisting the ICs. To position the heatsink 300 onto the PCB structure 100, the first side 302 having the integrally formed pockets 400 is positioned in abutment with the AESA such that each pocket 400 encloses a corresponding one of the plurality of functional blocks 200 of the AESA on the PCB structure 100. The waveguide manifold including holes and slots further assists with the heat dissipation for temperature decreases across the AESA. Referring to FIG. 5, the perspective view of the heatsink 300 having both pockets and the waveguide manifold 500 on the heatsink 300 is shown.

Figure 6:
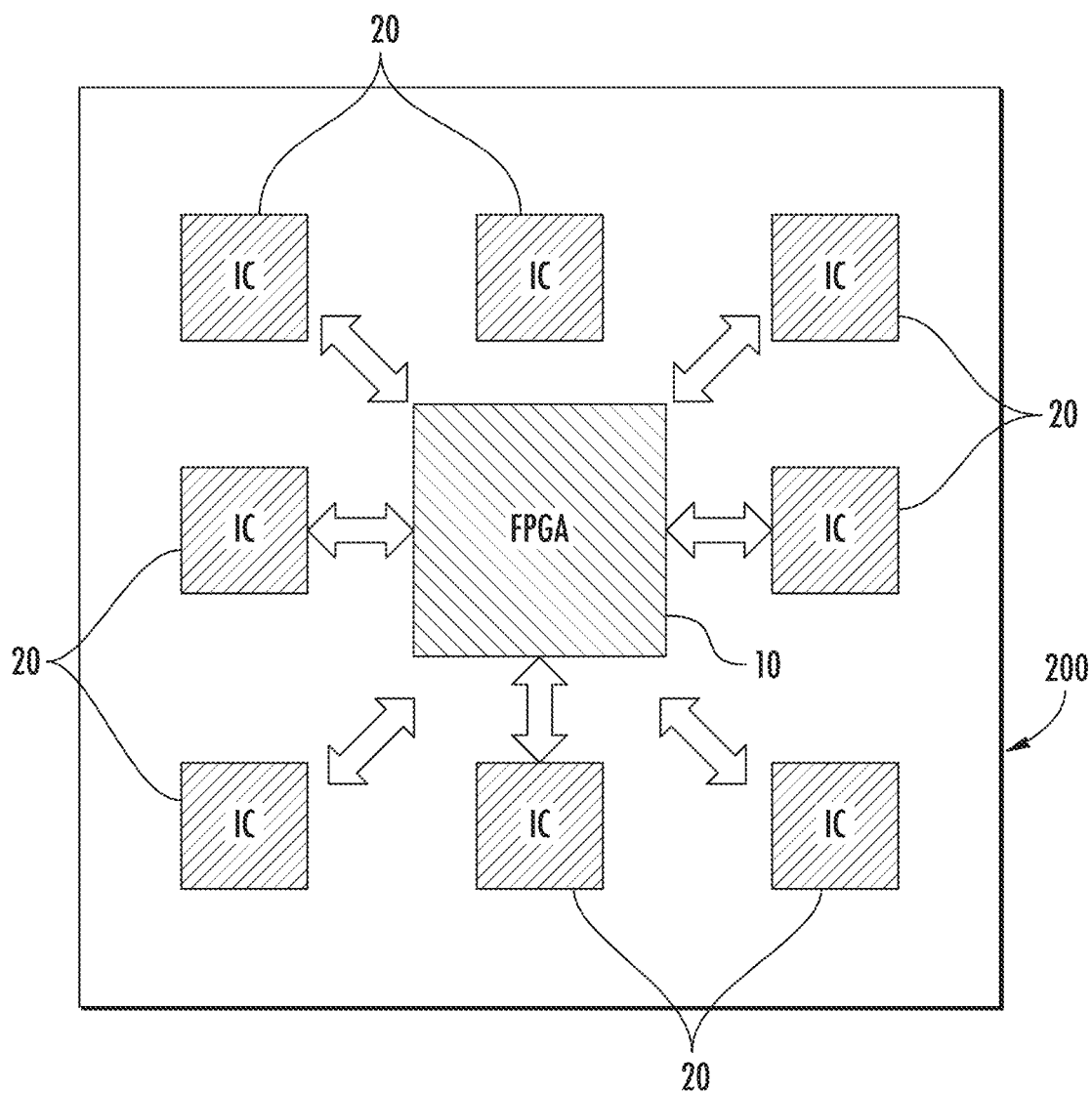
FIG. 6 illustrates a functional block of the AESA that a field-programmable gate array (FPGA) is surrounded by eight ICs.

FIG. 6 illustrates a functional block 200 of the AESA that contains one FPGA 12 surrounded by eight ICs 20. The FPGA 10 controls a localized temperature sensor (not shown) within each IC 20, thus controlling the thermal compensation of the individual IC 20 locally. Each IC 20 drives patch antennas located on the opposite side of the PCB structure 100.

Figure 7:
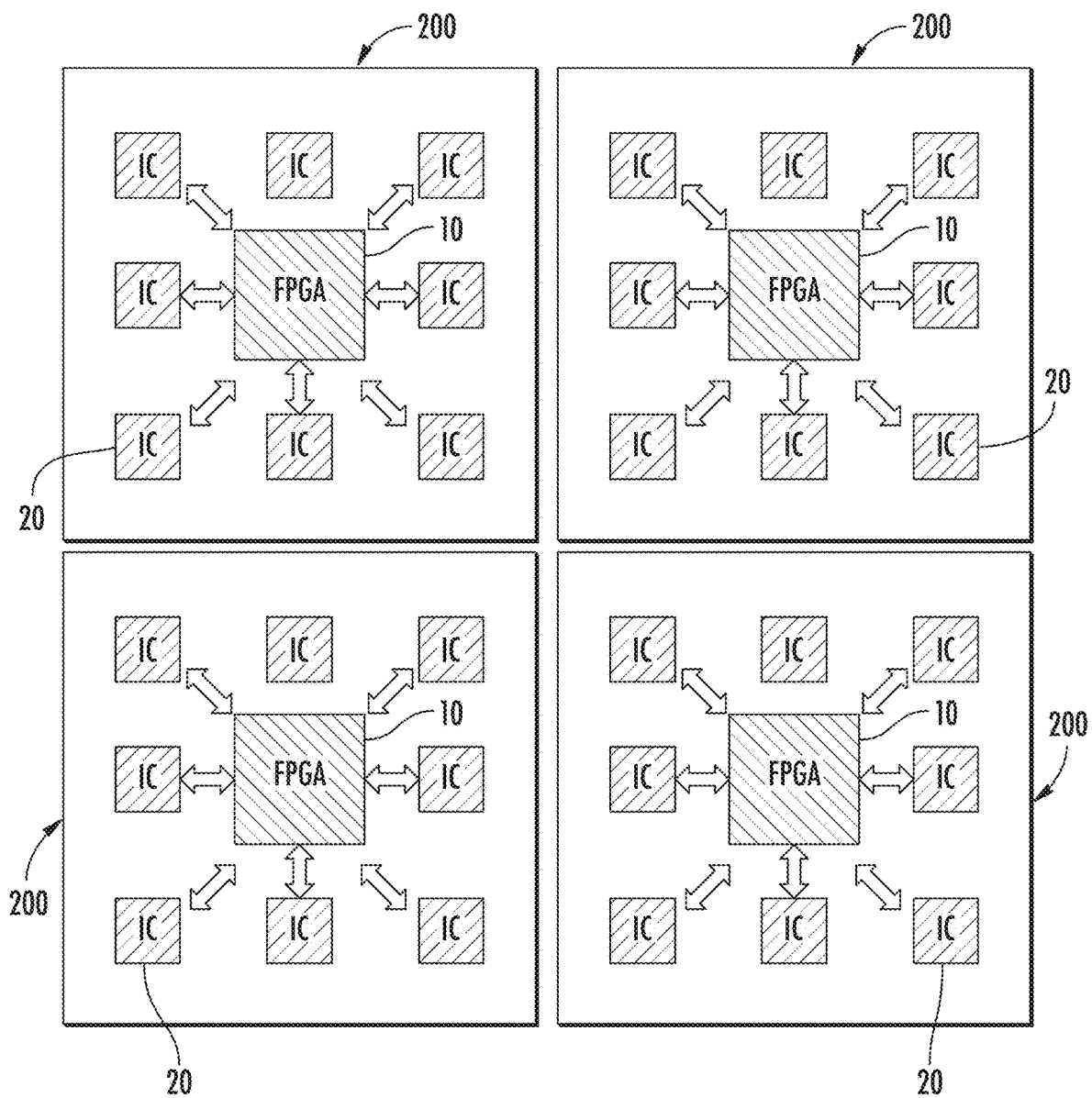
FIG. 7 illustrates a collective antenna array comprising functional blocks of the AESA.

Referring to FIG. 7, the plurality of functional blocks 200 of the AESA constitute a collective antenna array of modular architecture, and each functional block 200 includes one FPGA 10 surrounded by eight ICs 20. At the macroscopic level, the FPGAs 10 within the collective antenna array work together to steer the direction of the antenna beam or stay at a fixed direction to form a fixed beam. At the microscopic level, each FPGA 10 controls the thermal compensation within the eight ICs 20 of each functional block 200 for localized heat regulation.

While the present invention has been shown and described in accordance with several preferred and practical embodiments, it is recognized that departures from the instant disclosure are contemplated within the spirit and scope of the present invention.

What is claimed is:

1. A heatsink for heat dissipation amongst an active electronically steered array (AESA) on a printed circuit board (PCB) comprising:
   a metal plate including a first side and a second side;
   a plurality of integrally formed pockets on the first side of the metal plate each being sized and configured for congruent receipt of a corresponding one of a plurality of functional blocks of the AESA on the PCB;
   a plurality of waveguide manifolds on the second side of the metal plate including a plurality of holes that launch a wave transmission and a plurality of slots that guide the direction of the wave transmission; and
   wherein the metal plate prevents localized overheating amongst the AESA by positioning the metal plate on the PCB wherein the plurality of integrally formed pockets and the plurality of holes and the plurality of slots of the plurality of waveguide manifolds facilitate heat dissipation.

2. The heatsink as recited in claim 1, wherein the metal plate is made of aluminum.

3. The heatsink as recited in claim 1, wherein each of the plurality of integrally formed pockets is sized and configured to enclose each corresponding one of the plurality of functional blocks of the AESA to dissipate heat from the integrated circuits (ICs) that generate heat.

4. The heatsink as recited in claim 3, wherein the plurality of functional blocks of the AESA comprises one field-programmable gate array (FPGA) surrounded by eight ICs.

* * * * *